(12) United States Patent
Cheng

(10) Patent No.: US 8,994,129 B2
(45) Date of Patent: Mar. 31, 2015

(54) MECHANISMS FOR FORMING MICRO-ELECTRO MECHANICAL SYSTEM DEVICE

(71) Applicant: Taiwan Semiconductor Manufacturing Co., Ltd., Hsin-Chu (TW)

(72) Inventor: Chun-Ren Cheng, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 63 days.

(21) Appl. No.: 13/946,566

(22) Filed: Jul. 19, 2013

(65) Prior Publication Data

US 2015/0021723 A1     Jan. 22, 2015

(51) Int. Cl.
*B81B 7/00* (2006.01)
*B81C 1/00* (2006.01)

(52) U.S. Cl.
CPC ........... *B81B 7/0029* (2013.01); *B81C 1/00833* (2013.01)

USPC .............................................. 257/419; 438/53

(58) Field of Classification Search
USPC ...................................................... 257/419
See application file for complete search history.

(56) References Cited

U.S. PATENT DOCUMENTS

| | | | |
|---|---|---|---|
| 2002/0181844 A1* | 12/2002 | Vaganov | 385/17 |
| 2007/0145515 A1* | 6/2007 | Chen et al. | 257/499 |
| 2011/0241136 A1* | 10/2011 | Inaba | 257/415 |

* cited by examiner

*Primary Examiner* — Zandra Smith
*Assistant Examiner* — Lawrence Tynes, Jr.
(74) *Attorney, Agent, or Firm* — Birch, Stewart, Kolasch & Birch, LLP

(57) ABSTRACT

Embodiments of mechanisms for forming a micro-electro mechanical system (MEMS) device are provided. The MEMS device includes a substrate and a MEMS structure over the substrate, and the MEMS structure has a movable element. The movable element is surrounded by a cavity. The MEMS device also includes a fuse layer on the movable element, and the fuse layer has a wide portion and a narrow portion linked to the wide portion.

20 Claims, 10 Drawing Sheets

US 8,994,129 B2

MECHANISMS FOR FORMING MICRO-ELECTRO MECHANICAL SYSTEM DEVICE

BACKGROUND

The semiconductor integrated circuit (IC) has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Micro-electro mechanical system (MEMS) devices have been recently developed. MEMS devices include devices fabricated using semiconductor technology to form mechanical and electrical features. Examples of MEMS devices include gears, levers, valves, and hinges. The MEMS devices are implemented in accelerometers, pressure sensors, microphones, actuators, mirrors, heaters, and/or printer nozzles.

BRIEF DESCRIPTION OF THE DRAWINGS

For a more complete understanding of the embodiments, and the advantages thereof, reference is now made to the following descriptions taken in conjunction with the accompany drawings, in which.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

FIGS. 1A-1I are cross-sectional views of various stages of a process for forming a micro-electro mechanical system (MEMS) device, in accordance with some embodiments. Throughout the various views and illustrative embodiments, like reference numbers are used to designate like elements.

Figure 1A:
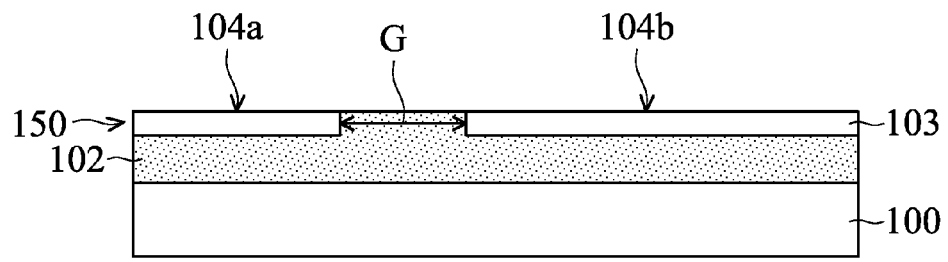
FIGS. 1A-1I are cross-sectional views of various stages of a process for forming a micro-electro mechanical system (MEMS) device, in accordance with some embodiments.

As shown in FIG. 1A, a support layer 102 and a semiconductor layer 103 are formed over a substrate 100, in accordance with some embodiments. In some embodiments, substrate 100 is a semiconductor substrate such as a silicon substrate. Other semiconductor materials, such as silicon germanium, silicon carbide, III-V compound materials, or the like, may be used. In some other embodiments, substrate 100 is a dielectric substrate. In some embodiments, a semiconductor on insulator (SOI) substrate is used to form the MEMS device.

In some embodiments, support layer 102 is made of a dielectric material, such as silicon oxide, silicon nitride, silicon oxynitride, silicon carbide, or another suitable material. Support layer 102 may be formed by using a thermal oxidation process, chemical vapor deposition (CVD) process (such as plasma enhanced chemical vapor deposition, PECVD), physical vapor deposition process (PVD), or another suitable process.

Afterwards, support layer 102 is patterned to form openings, and semiconductor layer 103 fills the openings, in accordance with some embodiments. Semiconductor layer 103 in the openings forms a MEMS structure 150. MEMS structure 150 includes elements 104a and 104b. Semiconductor layer 103 may be a polysilicon layer.

Semiconductor layer 103 may be formed by using a CVD process or another applicable deposition process. In some embodiments, a p-type or an n-type impurity, such as phosphorous, is in-situ doped during the deposition process of semiconductor layer 103. A planarization process, such as a chemical mechanical polishing (CMP) process, is performed after the deposition process. As a result, the excess semiconductor material outside of the openings of support layer 102 is removed. In some embodiments, a gap G is formed between elements 104a and 104b to ensure elements 104a and/or 104b are/is free to move after subsequent processes are performed, which will be described later. In some embodiments, element 104b is free to move while element 104a stays fixed after the subsequent processes are performed.

Figure 2A:
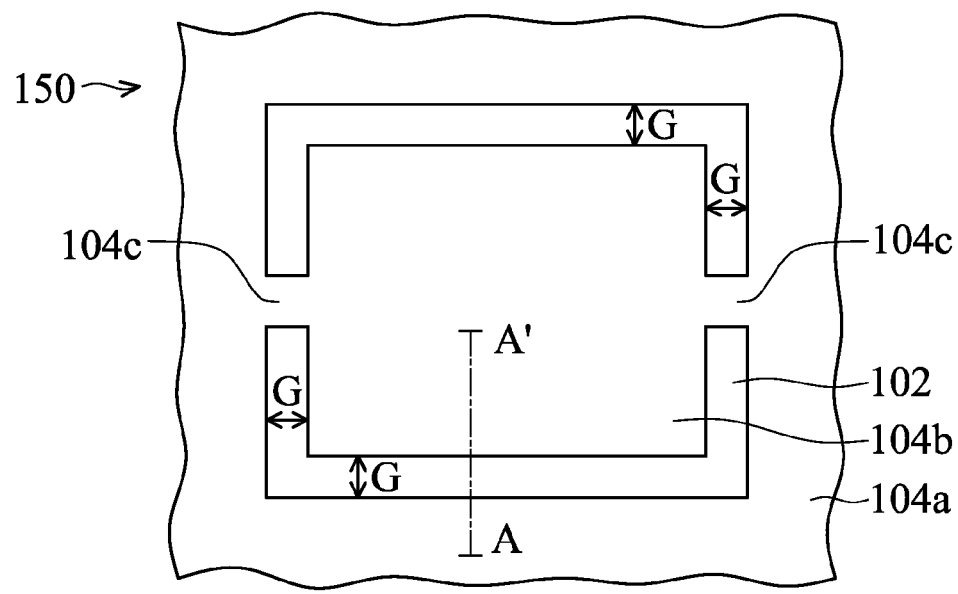
FIG. 2A is a top view of the structure shown in FIG. 1A, in accordance with some embodiments.

FIG. 2A shows a top view of the structure shown in FIG. 1A, in accordance with some embodiments. The cross-sectional view of FIG. 1A is cut along the section from A to A' shown in FIG. 2A. Elements 104a and 104b may have a variety of shapes, configurations, distributions, and/or sizes. As shown in FIG. 2A, element 104a surrounds element 104b, in accordance with some embodiments. In some other embodiments, other shapes and arrangements are also applicable for elements 104a and 104b.

Gaps G are formed between elements 104a and 104b such that element 104b is suspended. In some embodiments, there are multiple (or single) connecting elements 104c across gap G and physically link elements 104a and 104b. Therefore, suspension of element 104b is maintained.

Figure 1B:
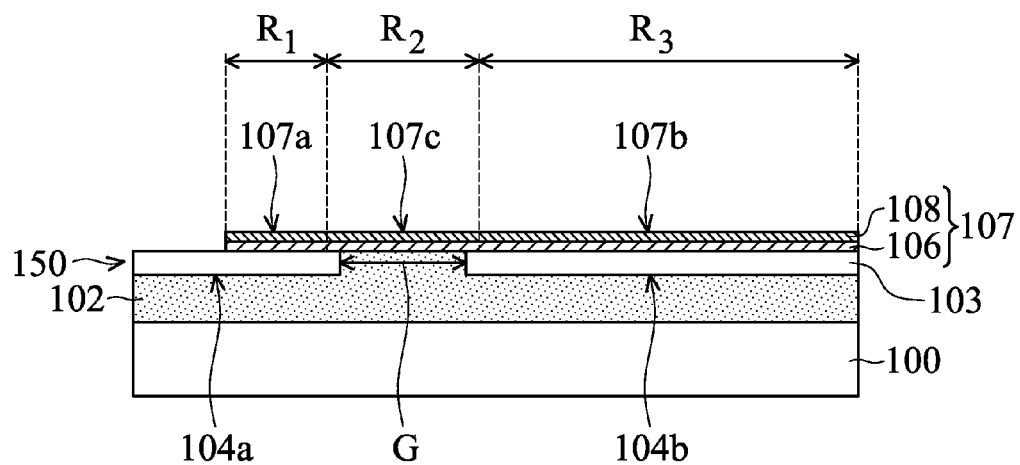

Afterwards, as shown in FIG. 1B, a fuse layer 107 is formed over elements 104a and 104b, in accordance with some embodiments. Fuse layer 107 is in direct contact with and adheres to elements 104a and 104b. In some embodiments, fuse layer 107 is made of an electrically conductive material, such as a metal material. In some embodiments, fuse layer 107 includes multiple sub-layers. For example, fuse layer 107 may include a sub-layer 106 and a sub-layer 108. Thicknesses of sub-layers 106 and 108 may be the same or different.

Sub-layers 106 and 108 are made of different metal material layers. In some embodiments, sub-layer 106 has a coefficient of thermal expansion (CTE) which is higher than that of sub-layer 108. The CTE difference between sub-layer 106 and sub-layer 108 may be in a range from about $4 \times 10^{-6}$/k to about $35 \times 10^{-6}$/k. For example, sub-layer 106 is made of Al, another suitable metal material, or combinations thereof. Sub-layer 108 is made of, for example, Ti, another suitable metal material, or combinations thereof.

Figure 2B:
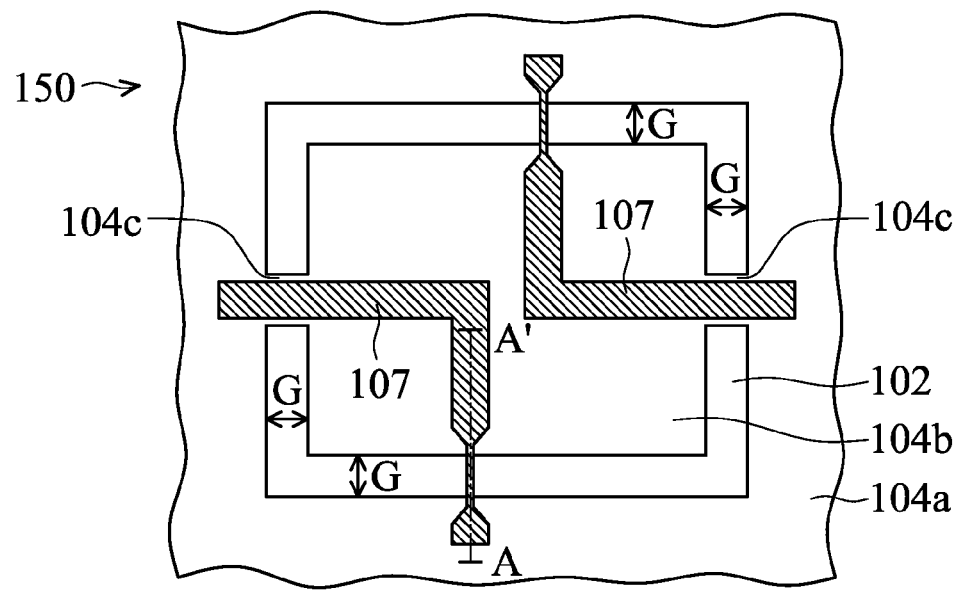
FIG. 2B is a top view of the structure shown in FIG. 1B, in accordance with some embodiments.

Sub-layers 106 and 108 may be sequentially deposited over semiconductor layer 103, and are then patterned to desired patterns. FIG. 2B shows a top view of the structure as shown in FIG. 1B, in accordance with some embodiments. The cross-sectional view of FIG. 1B is cut along the section from A to A' shown in FIG. 2B. As shown in FIG. 2B, fuse layer 107 has two sections. Each section of fuse layer 107 may be an L shape section. The L shape section of fuse layer 107 may extend across connecting element 104c and extending across gap G. In some embodiments, sub-layers 108 and 106 of fuse layer 107 have substantially the same patterns.

Figure 3A:
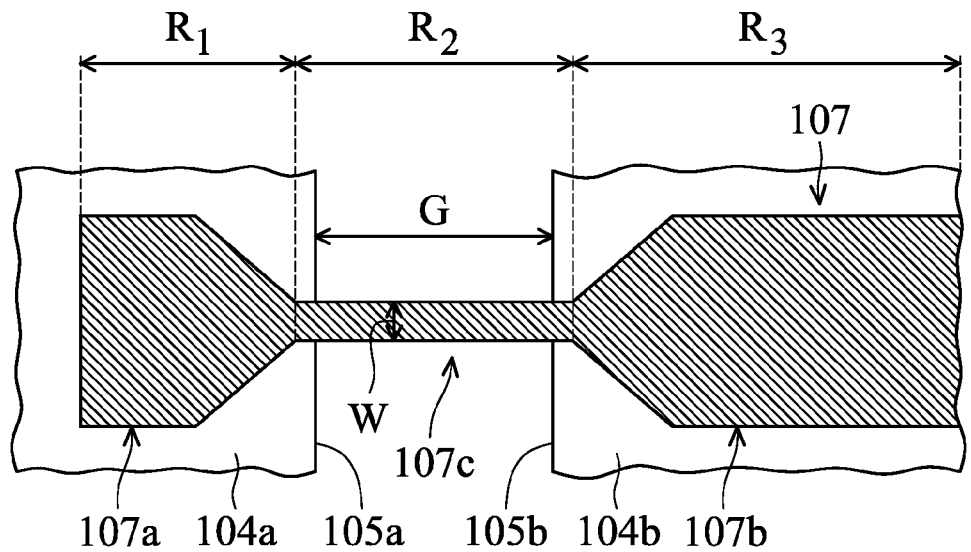
FIG. 3A shows an enlarged view of the fuse layer and the elements of the MEMS structure at the section from A to A' shown in FIG. 2B, in accordance with some embodiments.

FIG. 3A shows an enlarged view of fuse layer 107 and elements 104a and 104b of MEMS structure 150 at the section from A to A' shown in FIG. 2B, in accordance with some embodiments. As shown in FIGS. 1B and 3A, fuse layer 107 includes a narrow portion 107c in a region $R_2$ and wide portions 107a and 107b in regions $R_1$ and $R_3$. Narrow portion 107c extends across gap G and physically links with wide portions 107a and 107b. Narrow portion 107c has a high resistance than that of wide portions 107a and 107b. Therefore, narrow portion 107c and wide portions 107a and 107b of fuse layer 107 form a fuse, which would be blown or broken by applying an energy, such as a current. In some embodiments, narrow portion 107c is a strip with a width W in a range from about 1 nm to about 1 μm. Alternatively, narrow portion 107c may have other shapes with a narrowest width substantially equal to width W.

Figure 1C:
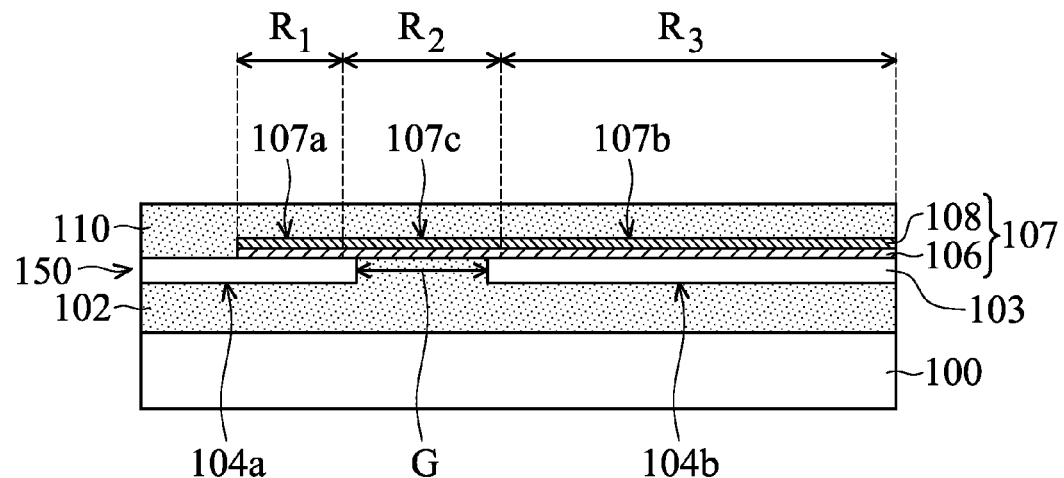

Afterwards, referring to FIG. 1C, a dielectric layer 110 is deposited over semiconductor layer 103 and fuse layer 107, in accordance with some embodiments. Dielectric layer 110 may be made of silicon oxide, silicon nitride, silicon oxynitride, silicon carbide, or another suitable material. A suitable process, such as a CVD process, PVD process, another applicable process, may be used to form dielectric layer 110.

Figure 1D:
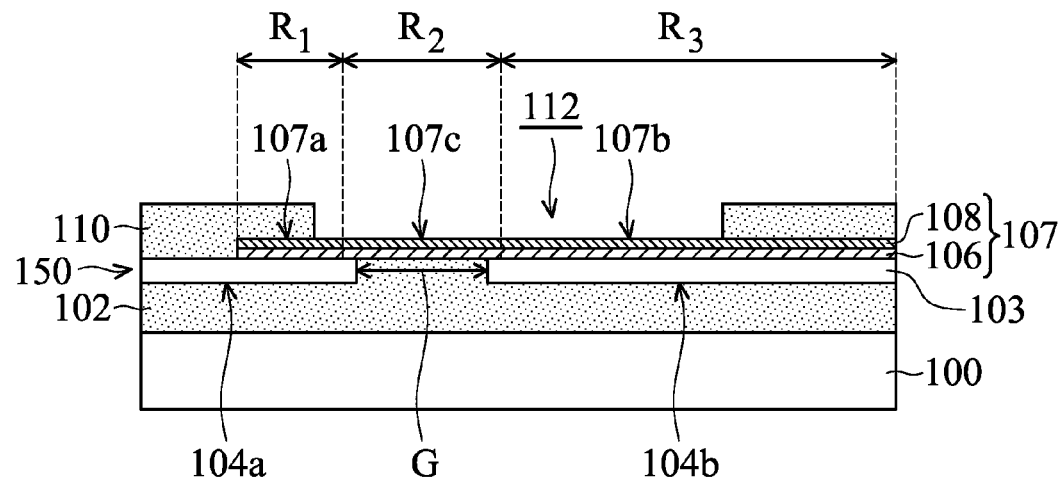

Afterwards, as shown in FIG. 1D, dielectric layer 110 is patterned to form an opening 112, which exposes sub-layer 108 of fuse layer 107, in accordance with some embodiments. For example, a photolithography process and an etching process is performed to form opening 112.

Figure 1E:
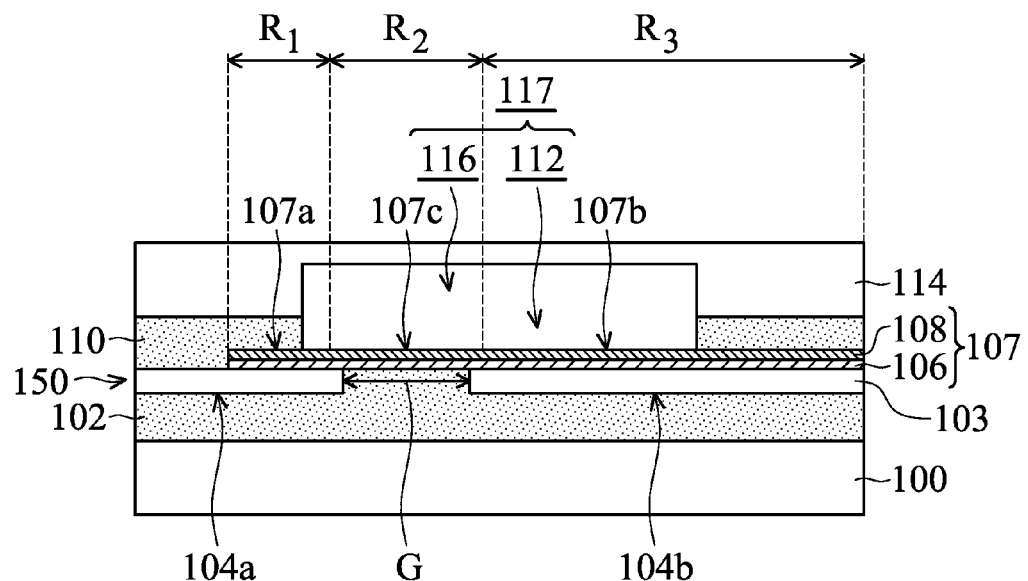

Afterwards, as shown in FIG. 1E, a cap substrate 114 is bonded to dielectric layer 110, in accordance with some embodiments. Cap substrate 114 may include a semiconductor substrate, dielectric substrate, or another applicable substrate. In some embodiments, cap substrate 114 is a silicon substrate including an opening 116. After cap substrate 114 is bonded to dielectric layer 110, a cavity 117 containing openings 112 and 116 is formed.

Cap substrate 114 may be bonded to dielectric layer 110 by using a fusion bonding process, plasma activated bonding process, thermocompression bonding process, diffusion bonding process, anodic bonding process, another applicable bonding process, or combinations thereof. Alternatively, an adhesion layer (not shown) may be used to bond cap substrate 114 to dielectric layer 110.

Figure 1F:
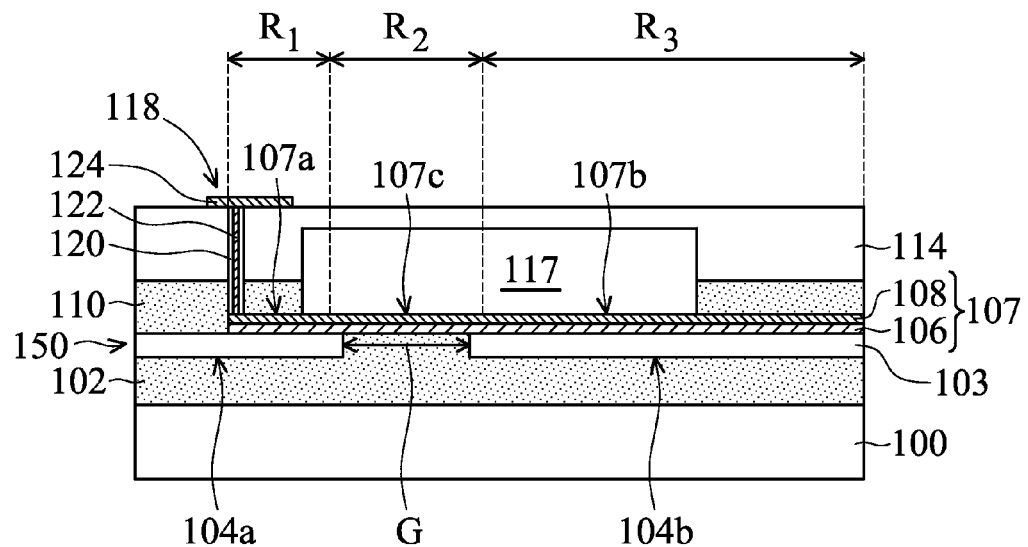

Afterwards, as shown in FIG. 1F, conductive structure 118 is formed over element 104a to electrically connect to fuse layer 107, in accordance with some embodiments. As shown in FIG. 1F, conductive structure 118 is formed near an end of fuse layer 107. Conductive structure 118 includes, for example, a through substrate via 122, an insulating layer 120, and a conductive pad 124. Through substrate via 122 is formed in cap substrate 114. Through substrate via 122 may be made of Cu, Al, AlCu, or other applicable materials. Insulating layer 120 surrounds through substrate via 120 for electrically isolating through substrate via 120 to cap substrate 114. Conductive pad 124 is formed over through substrate via 122. Conductive structure 118 is electrically connected to, for example, wide portions 107a and 107b of fuse layer 107. In some embodiments, insulating layer 120 is omitted when cap substrate 114 is made of a dielectric material. In some embodiments, conductive structure 118 further comprises a diffusion barrier layer (not shown) surrounding through substrate via 122.

Figure 2C:
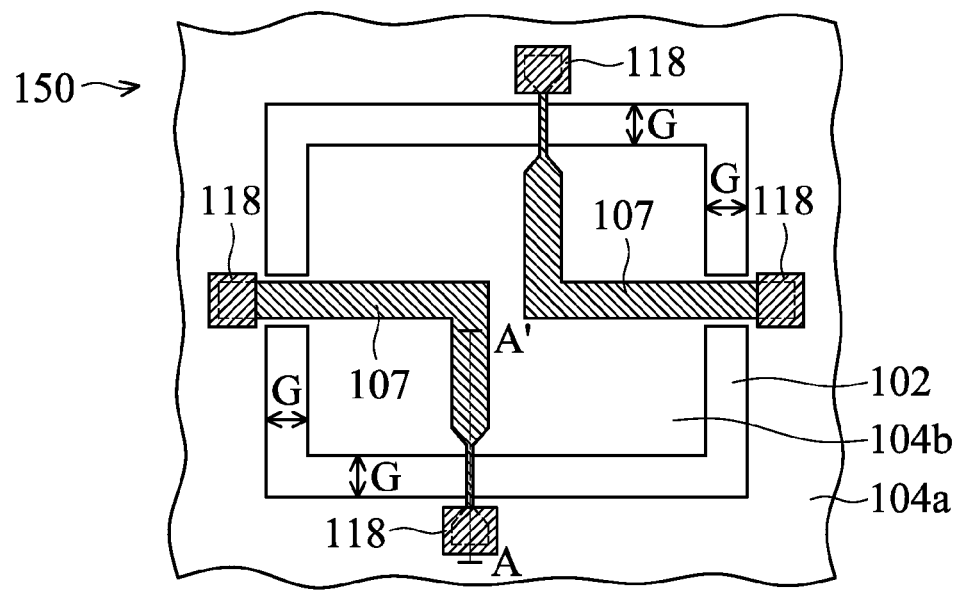
FIG. 2C is a top view of the structure shown in FIG. 1F, in accordance with some embodiments.

FIG. 2C shows a top view of the MEMS device as shown in FIG. 1F, in accordance with some embodiments. The cross-sectional view of FIG. 1F is along the section from A to A' shown in FIG. 2C. It should be noted that, for clarity, cap substrate 114 is not shown in FIG. 2C. As shown in FIG. 2C, another conductive structure 118 is formed at another end of fuse layer 107. Conductive structure 118 may have the same structure with conductive structure 118. In some embodiments, conductive structures 118 function as electrodes for providing a current to fuse layer 107 in sequent processes.

Figure 1G:
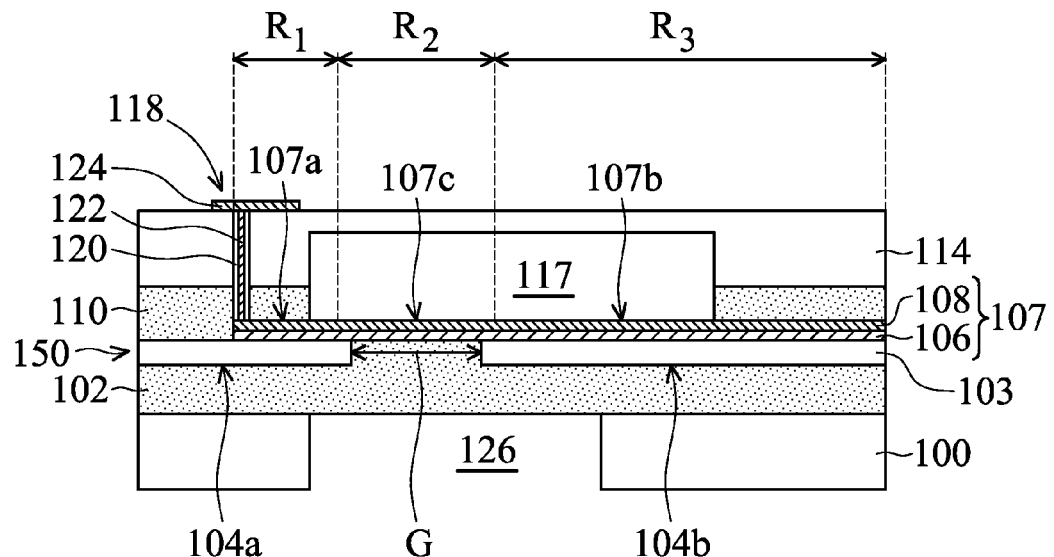

As shown in FIG. 1G, substrate 100 is partially removed from a bottom surface of substrate 100 to form an opening 126, in accordance with some embodiments. A photolithography process and an etching process may be performed to form opening 126. Opening 126 exposes support layer 102.

Figure 1H:
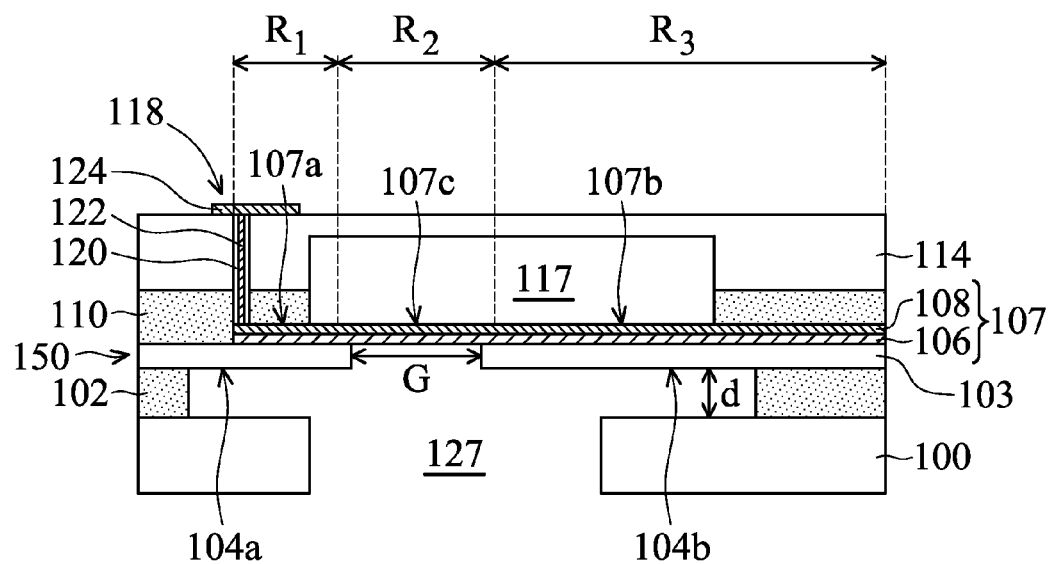

Afterwards, as shown in FIG. 1H, support layer 102 is partially removed to form a cavity 127. Cavity 127 exposes elements 104a and 104b and a portion of sub-layer 106 of fuse layer 107, in accordance with some embodiments. Elements 104a and/or 104b may be supported by the remaining portion of support layer 102. Elements 104a and 104b are secured by fuse layer 107.

Support layer 102 may be removed by an etching process, such as a wet etching process, dry etching process, or combinations thereof. A dry etching process using a vapor phase etchant, such as vapor HF, may be more expensive than a wet etching process. In addition, using the dry etching process to remove support layer 102 results in formation of unwanted byproducts. Therefore, in some cases, a wet etching process is more desirable.

In some embodiments, a wet etching process is used to remove support layer 102. Afterwards, a drying process, such as a spin drying process, is performed to the structure shown in FIG. 1H. During the drying process, elements 104a and 104b are wet and are susceptible to stick to substrate 100. High speed rotation of the drying process may cause elements 104a and 104b to be damaged or ruptured. Due to fuse layer 107, the problems mentioned above are prevented.

In some embodiments, elements 104a and 104b do not stick to substrate 100, and elements 104a and 104b are not damaged or ruptured. It is because elements 104a and 104b are secured by fuse layer 107. Fuse layer 107 effectively limits the motions, such as vibration, rotation and deformation, of elements 104 and 104b during the drying process. In addition, fuse layer 107 provides additional mechanical support to elements 104a and 104b. In some embodiments, elements 104a and 104b are sufficiently protected by the formation of fuse layer 107 even if a distance between elements 104a and 104b is small, such as smaller than about 1 μm.

Figure 1I:
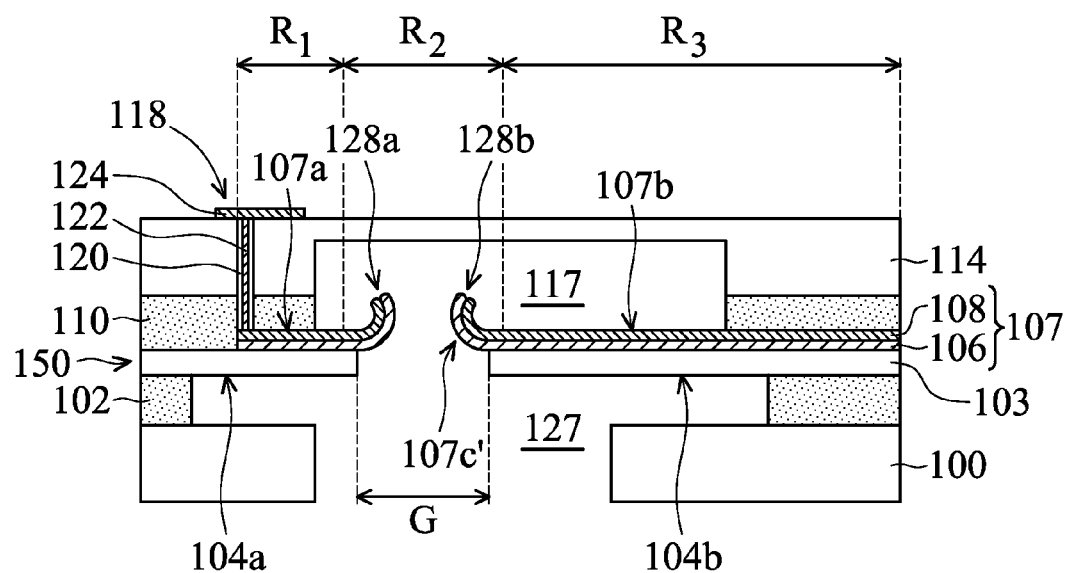

As shown in FIG. 1I, a current is provided to fuse layer 107, in accordance with some embodiments. Narrow portion 107c of fuse layer 107 is heated and blown due to joule effect. The following Equation shows Joule' first law.

$$Q=I^2Rt=V^2/R$$

Q represents the heat generated and t is the time passed. The heat generated increases the temperature of fuse layer 107, especially for narrow portion 107c which has the high resistance. When the temperature is high enough, narrow portion 107c of fuse layer 107 may melt and blown.

As shown in FIG. 1I, after fuse layer 107 is blown, narrow portion 107c' of fuse layer 107 is discontinued, and curled structures 128a and 128b are formed, in accordance with some embodiments. Due to the CTE mismatch between sub-layers 108 and 106, sub-layer 108 expands at a smaller degree than that of sub-layer 106 when fuse layer 107 is heated. Curled structures 128a and 128b curl upwardly and away from elements 104a and 104b. The end portions of curled structures 128a and 128b are not coplanar with wide portion 107a and 107b.

Figure 2D:
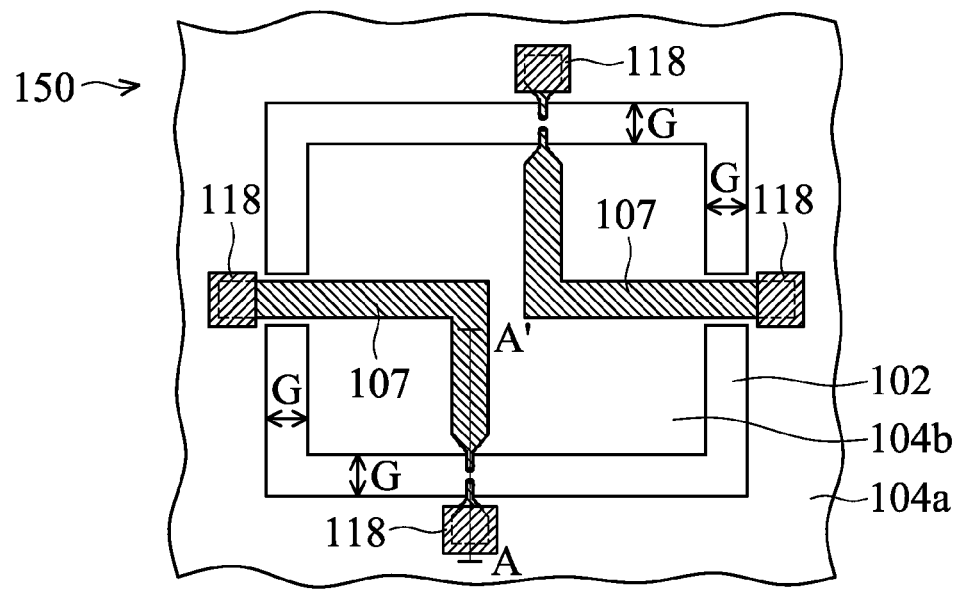
FIG. 2D is a top view of the structure shown in FIG. 1I, in accordance with some embodiments.
Figure 3B:
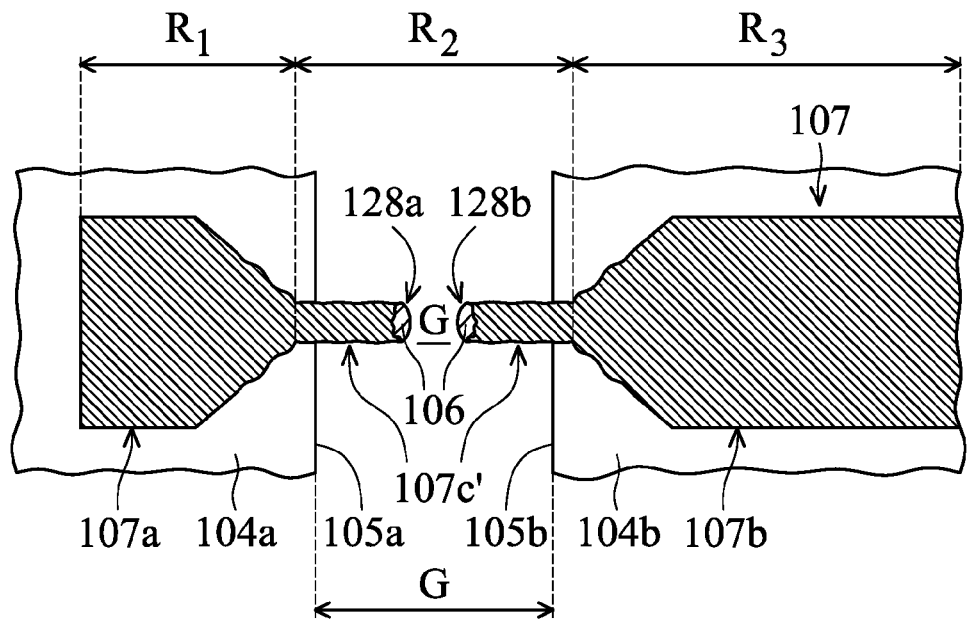
FIG. 3B shows an enlarged view of the fuse layer and the elements of the MEMS structure with curled structures at section from A to A' shown in FIG. 2D, in accordance with some embodiments.

FIG. 2D shows a top view of the structure as shown in FIG. 1I, in accordance with some embodiments. The cross-sectional view of FIG. 1I is cut along the section from A to A' shown in FIG. 2D. FIG. 3B shows an enlarged view of fuse layer 107 and elements 104a and 104b with curled structures 128a and 128b at section from A to A' shown in FIG. 2D. It should be noted that, for clarity, cap substrate 114 is not shown in FIGS. 2D and 3B. As shown in FIGS. 2D and 3B, narrow portion 107c' of fuse layer 107 is discontinued at gap G between elements 104a and 104b. Sub-layer 106 covers sub-layer 108 at or near the end portions of curled structures 128a and 128b.

Since narrow portion 107c' of fuse layer 107 is discontinued, fuse layer 107 is no longer one piece with elements 104a and 104b of MEMS structure 150. Elements 104a and 104b is on longer secured by fuse layer 107. In some embodiments, only element 104b is free to move, and element 104a is still fixed. Alternatively, elements 104a and 104b of MEMS structure 150 are both released and free to move.

During operation, the MEMS device may receive a wave such as an acoustic wave. Element 104b of MEMS structure 150 may thus bend, vibrate, deform, or the like. The motions of elements 104a and 104b respect to the wave cause a capacitance difference, thereby generating electrical signals.

Figure 4:
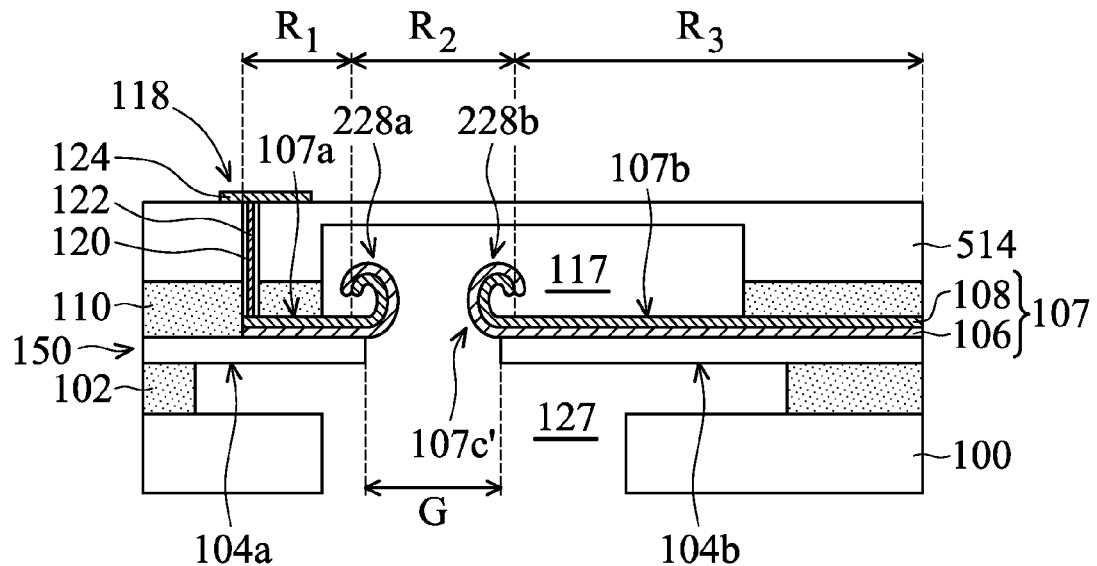
FIG. 4 is a cross-sectional view of a MEMS device, in accordance with some embodiments.

FIG. 4 shows a cross-sectional view of a MEMS device, in accordance with some embodiments. The structure shown in FIG. 4 is similar to that shown in FIG. 1H except that spiral structures 228a and 228b are formed after fuse layer 107 is blown. Spiral structures 228a and 228b may be formed when the CTE mismatch between sub-layers 108 and 106 is large.

Figure 5:
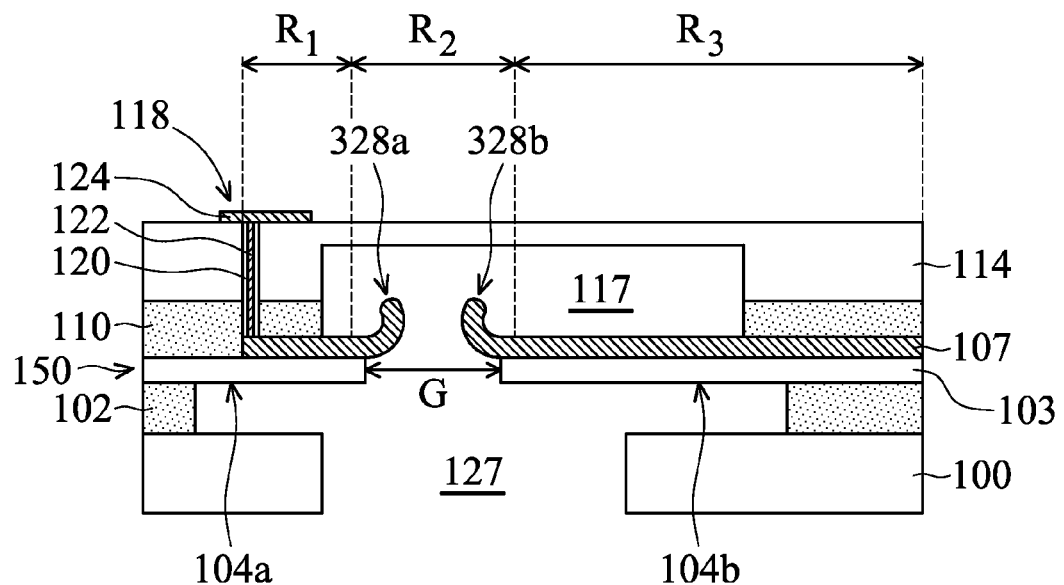
FIG. 5 is a cross-sectional view of a MEMS device, in accordance with some embodiments.

In some embodiments, fuse layer 107 is a single layer. FIG. 5 shows a cross-sectional view of a MEMS device, in accordance with some embodiments. The structure shown in FIG. 5 is similar to that shown in FIG. 1H. In some embodiments, fuse layer 107 is a single layer, such as a metal layer or another suitable layer. Fuse layer 107 is also used to secure elements 104a and 104b during the etching process and the drying process. Similarly, after a current is applied, narrow portion 107c of fuse layer 107 may melt and be blown. After fuse layer 107 is blown, elements 104a and/or 104b are released and free to move. Due to the CTE mismatch between fuse layer 107 and semiconductor layer 103, elements 104a and 104b are also curled upwardly to form curled structures 328a and 328b.

Figure 6:
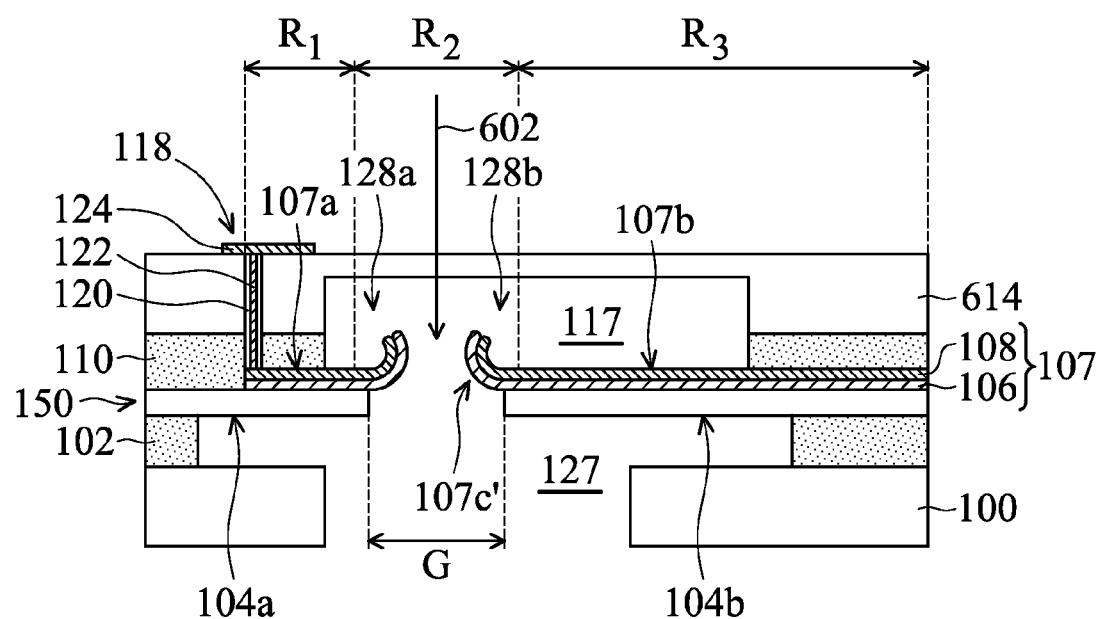
FIG. 6 is a cross-sectional view of an intermediate stage in the manufacturing of a MEMS device, in accordance with some embodiments.

The energy used to blow narrow portion 107c of fuse layer 107 is not limited be the electrical energy. FIG. 6 shows a cross-sectional view of an intermediate stage in the manufacturing of a MEMS device, in accordance with some embodiments. As shown in FIG. 6, a structure similar to that shown in FIG. 1H is provided.

In some embodiments, a cap substrate 614 is bonded to dielectric layer 110, as shown in FIG. 1H. Cap substrate 614 is made of a material capable of allowing light 602 to penetrate through cap substrate 614. Fuse layer 107 is thus irradiated with light 602. Light 602 is capable of blowing narrow portion 107c of fuse layer 107. For example, light 602 is a laser light or another applicable light. Cap substrate 614 may be made of glass, quartz, another suitable material, or combinations thereof. A transmittance of cap substrate 614 in the wavelength range of light 602 may be in a range from about 85% to about 99%. As shown in FIG. 6, curled structures 128a and 128b are also formed after fuse layer 107 is blown. When light 602 is used to blow narrow portion 107c of fuse layer 107, conductive structures 118 is not needed.

It is appreciated that embodiments of the disclosure are not limited to the embodiments described above. In some embodiments, fuse layer 107 is made of a metal material with a coil pattern. As such, a current may generated to blow fuse layer 107 when a magnetic field is applied to the coil pattern. In these embodiments, conductive structures 118 is not needed.

In some embodiments, the energy, such as the current, light irradiation or magnetic filed, is provided to fuse layer 107 after the MEMS device is packaged. In some embodiments, narrow portion 107c of fuse layer 107 is blown once after the MEMS device is packaged. In some embodiments, a user of a final product, which includes the MEMS device, turns on the final product to provide the current to fuse layer 107. Therefore, the MEMS device of the final product may be prevented from being damaged during manufacturing and transportation. In these cases, fuse layer 107 may remain without being fused or blown in some semiconductor devices.

In some embodiments, there is another structure (not shown) formed between the substrate and the semiconductor layer. In these embodiments, support layer 102 may be completely removed, and elements 104a and 104b are supported by another structure in the final product.

In some embodiments, fuse layer 107 does not have to be made of the electrically conductive material. For example, fuse layer 107 may be made of a semiconductor material, polymer material, ceramic material, or other materials available to form a fuse.

Embodiments of mechanisms for forming a MEMS device described above form a fuse layer on a movable element of the MEMS device. The movable element is prevented from being damaged during the manufacturing process and/or transportation. The fuse layer includes a narrow portion. The movable element is released and free to move after the narrow portion is blown. By forming the fuse layer, yield of the MEMS device is significantly improved.

In accordance with some embodiments, a MEMS device is provided. The MEMS device includes a substrate and a MEMS structure over the substrate, and the MEMS structure has a movable element. The movable element is surrounded by a cavity. The MEMS device also includes a fuse layer on the movable element, and the fuse layer has a wide portion and a narrow portion linked to the wide portion.

In accordance with some embodiments, a semiconductor device is provided. The semiconductor device includes a substrate and a MEMS structure over the substrate, and the MEMS structure includes a first element and a second element. The first element is surrounded by a cavity, and a gap is between the first element and the second element. The semiconductor device also includes a fuse layer on the MEMS structure and securing the first element and the second element. The fuse layer has a narrow portion linked with a wide portion, and the narrow portion extends across the gap.

In accordance with some embodiments, a method for forming a MEMS device is provided. The method includes providing a substrate and forming a support layer over the substrate. The method also includes forming a MEMS structure over the substrate, and the MEMS structure includes a first element and a second element. The method further includes forming a fuse layer to secure the first element and the second element and partially removing the support layer. The first element is thus surrounded by a cavity, and an gap is formed between the first element and the second element. In addition, the method includes blowing a portion of the fuse layer such that the first element becomes movable.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A micro-electro mechanical system (MEMS) device, comprising:
   a substrate;
   a MEMS structure over the substrate, wherein the MEMS structure has a movable element, the movable element is surrounded by a cavity; and
   a fuse layer on the movable element, wherein the fuse layer has a wide portion and a narrow portion linked to the wide portion.

2. The MEMS device as claimed in claim 1, wherein the narrow portion of the fuse layer extends outside of the movable element.

3. The MEMS device as claimed in claim 1, wherein the fuse layer is made of a metal material.

4. The MEMS device as claimed in claim 1, wherein the narrow portion of the fuse layer comprises a curled structure.

5. The MEMS device as claimed in claim 4, wherein the curled structure curls upwardly and away from the movable element.

6. The MEMS device as claimed in claim 1, wherein the fuse layer comprises a stack of multiple sub-layers.

7. The MEMS device as claimed in claim 6, wherein the stack comprises a first metal sub-layer and a second metal sub-layer, the first metal sub-layer is between the second metal sub-layer and the movable element, and a coefficient of thermal expansion (CTE) of the first metal sub-layer is higher than that of the second metal sub-layer.

8. The MEMS device as claimed in claim 1, wherein the MEMS structure further has an element, a gap is between the element and the movable element, and the element and the movable element are made of the same material.

9. The MEMS device as claimed in claim 8, further comprising:
   a dielectric layer over the MEMS structure;
   a cap substrate bonded to the dielectric layer; and
   a through substrate via formed in the cap substrate and connected to the wide portion of the fuse layer.

10. The MEMS device as claimed in claim 1, further comprising:
    a dielectric layer over the MEMS structure; and
    a cap substrate bonded to the dielectric layer, wherein the cap substrate is made of a material capable of allowing a light to penetrate through the cap substrate.

11. The MEMS device as claimed in claim 1, wherein the fuse layer is in direct contact with the movable element.

12. A semiconductor device, comprising:
    a substrate;
    a MEMS structure over the substrate, wherein the MEMS structure comprises a first element and a second element, the first element is surrounded by a cavity, and a gap is between the first element and the second element; and
    a fuse layer on the MEMS structure and securing the first element and the second element, wherein the fuse layer has a narrow portion linked with a wide portion, and the narrow portion extends across the gap.

13. The semiconductor device as claimed in claim 12, wherein the fuse layer is a single layer.

14. The semiconductor device as claimed in claim 12, wherein the fuse layer comprises a stack of multiple sub-layers, and at least two of the sub-layers have different coefficients of thermal expansion.

15. The semiconductor device as claimed in claim 12, further comprising a conductive structure electrically connected to the fuse layer.

16. A method for forming a micro-electro mechanical system (MEMS) device, comprising:
    providing a substrate;
    forming a support layer over the substrate;
    forming a MEMS structure over the substrate, wherein the MEMS structure comprises a first element and a second element;
    forming a fuse layer to secure the first element and the second element;
    partially removing the support layer such that the first element is surrounded by a cavity, and an gap is formed between the first element and the second element; and blowing a portion of the fuse layer such that the first element becomes movable.

17. The method for forming a MEMS device as claimed in claim 16, wherein the fuse layer has a narrow portion linked with a wide portion, the narrow portion extends across the gap.

18. The method for forming a MEMS device as claimed in claim 17, further comprising forming a conductive structure electrically connected to the fuse layer, wherein the step of blowing the fuse layer comprises:
   applying a current to the fuse layer through the conductive structure such that the narrow portion is heated and blown.

19. The method for forming a MEMS device as claimed in claim 18, further comprising:
   forming a dielectric layer over the MEMS structure;
   bonding a cap substrate to the dielectric layer; and
   forming a through substrate via in the cap substrate to form a portion of the conductive structure.

20. The method for forming a MEMS device as claimed in claim 17, wherein the step of blowing the fuse layer comprises irradiating the narrow portion with a light such that the narrow portion is blown.

\* \* \* \* \*